United States Patent [19]

Schorman et al.

[11] Patent Number: 5,081,707
[45] Date of Patent: Jan. 14, 1992

[54] KNOWLEDGE BASED RADIO

[75] Inventors: Eric R. Schorman, Bedford; Charles W. Bethards, Colleyville, both of Tex.

[73] Assignee: Motorola, Inc., Schaumburg, Ill.

[21] Appl. No.: 391,052

[22] Filed: Aug. 8, 1989

[51] Int. Cl.⁵ .................... H04B 17/02; H03G 3/00
[52] U.S. Cl. ................................ 455/186; 455/345; 381/86; 381/107
[58] Field of Search ................ 455/80, 89, 185, 186, 455/226, 297, 234, 238, 152, 166, 345, 355; 340/539, 441; 381/57, 86, 107

[56] References Cited

U.S. PATENT DOCUMENTS

| | | | |
|---|---|---|---|
| 2,080,554 | 5/1937 | Wolff | 455/238 |
| 4,506,380 | 3/1985 | Matsui | 38/86 |
| 4,521,914 | 6/1985 | Petrovic | 455/186 |
| 4,525,865 | 6/1985 | Mears | 455/186 |
| 4,665,385 | 5/1987 | Henderson | 455/89 |
| 4,677,389 | 6/1987 | Op de Beek et al. | 455/238 |
| 4,688,258 | 8/1987 | Kunugi et al. | 381/107 |
| 4,706,086 | 11/1987 | Panizza | 340/539 |
| 4,754,255 | 6/1988 | Sanders et al. | 340/539 |
| 4,833,728 | 5/1989 | Kimura et al. | 455/186 |
| 4,843,588 | 6/1989 | Flynn | 455/186 |
| 4,864,246 | 9/1989 | Kato et al. | 455/238 |
| 4,939,786 | 7/1990 | McCallum et al. | 455/127 |

FOREIGN PATENT DOCUMENTS

| | | | |
|---|---|---|---|
| 0145171 | 6/1985 | European Pat. Off. | 455/152 |
| 0219834 | 12/1983 | Japan | 455/238 |

Primary Examiner—Curtis Kuntz
Assistant Examiner—Andrew Faile
Attorney, Agent, or Firm—Steven G. Parmelee

[57] ABSTRACT

A knowledge based radio that monitors changed operating parameters and environmental conditions, and that selectively varies operating parameters of the radio in response to rules. The rules can be varied over time by the radio based upon the monitored response of the user to various environmental conditions.

2 Claims, 2 Drawing Sheets

1

KNOWLEDGE BASED RADIO

TECHNICAL FIELD

This invention relates generally to radios, and more particularly to apparatus and methods for facilitating control of a radio.

BACKGROUND ART

Land mobile radio communication systems are well known. Typically, such a system includes a plurality of communication units, including both fixed location transceivers and mobile and portable transceivers. In many such systems, some form of system supervision or control equipment is also provided.

Over time, such systems have become more complex. As a result, the ability of a manufacturer to provide a specific customer with a radio that meets the specific and particular needs of that customer, and/or the ability of a customer to anticipate, prior to receipt and use of a radio, the precise configuration for that radio that would best suit the needs of the user, has become more difficult.

Expert (or artificially intelligent systems) are also known. Such knowledge based systems (KBS) are usually characterized by a knowledge base of facts and rules, and an inference engine. The inference engine inspects and applies the rules using the facts. A KBS can typically be readily expanded, once provided, as rules and facts may be added to the knowledge base rather than specific additional cases representing new specific scenarios.

To date, no one has provided a knowledge based radio that would meet at least some of the needs for providing a user with a radio that is more compatible with the needs of that user. Instead, there have been provided only simple controls based on the current state of one or more inputs, without regard to prior knowledge or learning. For example, one prior art control might be to set the volume level for the audio amplifier circuit as a function of a current volume control setting and measured ambient noise level in the vicinity of the radio. Such systems reflect only predetermined adaptations, and are based only on current inputs (with some provision, of course, of minor hysterisis for stability).

SUMMARY OF THE INVENTION

The inventors have provided a knowledge based radio, described herein. In particular, the radio has a plurality of operating parameters, and responds to various environmental conditions. The particular response that the radio makes to a particular environmental condition is selectively alterable.

The radio includes inputs for obtaining information regarding at least some environmental conditions. In one embodiment, for example, the radio can receive sensor input regarding speed of a vehicle within which the radio is located. Other environmental information could include, for example, the time of day. This stored information comprises at least part of the facts upon which the inference engine may operate through application of its rules.

The radio also includes a memory for storing information regarding at least some previous environmental conditions, information regarding at least some current operating parameters, and information regarding at least some previous operating parameters.

The radio also includes a control unit that responds to both the inputs and the memory. The control unit constitutes the inference engine, and relates current environmental conditions and current operating parameters to previous environmental conditions and operating parameters. The control unit then adjusts, when appropriate, at least one of the selectively alterable operating parameters.

BEST MODE FOR CARRYING OUT THE INVENTION

Figure 1:
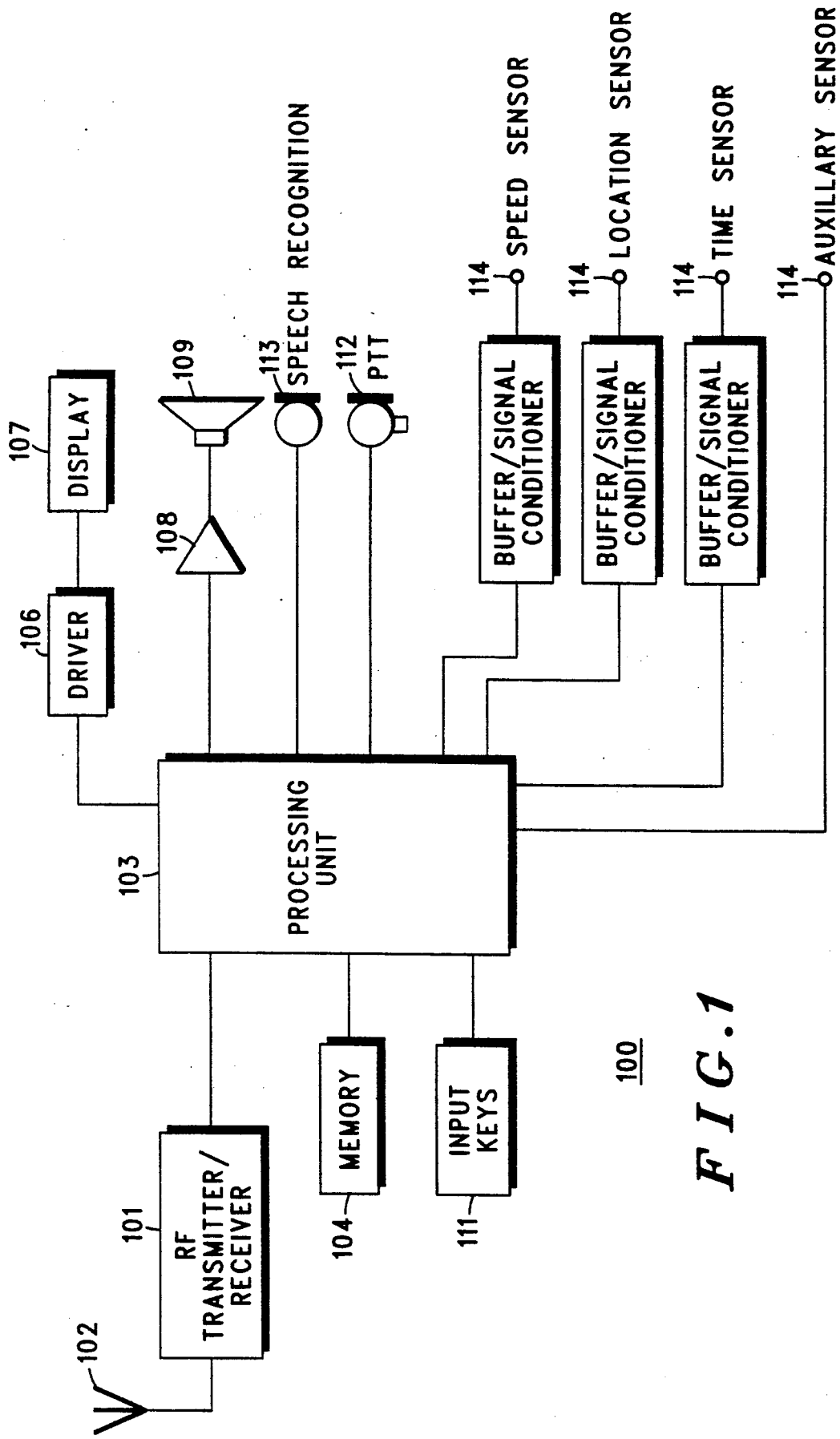
FIG. 1 comprises a block diagram depiction of a radio constructed in accordance with the invention.

A radio constructed in accordance with the invention can be seen in FIG. 1 as depicted generally by the reference numeral 100. The radio (100) includes an RF transceiver (101) and an antenna (102) as well understood in the art. This transceiver (101) couples to a processing unit (103). The processing unit (103) comprises a logic and signal processing platform, and may include, for example, an appropriate microprocessor such as an MC68030 family processor operating in conjunction with a digital signal processor, such as a DSP 56000 family device, both manufactured and offered for sale by Motorola, Inc. Other circuitry may be included as well, such as digital to analog and analog to digital converters for use in conjunction with the digital signal processor and other input/output interface and support circuitry. The processing unit (103) couples to an appropriate memory (104), which may include, for example, volatile memory (such as RAM) and non-volatile memory (such as ROM, PROM, and EEPROM). The memory (104) can be used to store operating instructions for the processing unit (103) and can also store historical parameter facts as described below in more detail.

The processing unit (103) also interfaces with a number of input and output devices. For example, the processing unit (103) provides information to be displayed to a driver (106) and display (107) (such as one or more LED's, an LCD display, or a CRT). Audio information, such as received voice information, or synthesized speech messages as sourced by the processing unit (103), are provided through an amplifier (108) to an appropriate audio transducer (109).

Inputs to the processing unit (103) include one or more input keys (111) (such as independent dedicated push button keys, touch screen soft keys, DTMF keys, or a full alphanumeric keypad). The processing unit may also receive voice input from a user through a push-to-talk microphone (112) (which voice messages would typically be intended for subsequent transmission by the transceiver (101), and a speech recognition input microphone (113) (which microphone (113) would ordinarily be intended for receiving speech messages intended to provide control of radio operating parameters). Finally, the processing unit (103) includes a plurality of environmental condition sensors (114), such as a speed sensor for receiving signals regarding the speed of a vehicle within which the radio (100) is situated, location information as received from an appropriate location determination device (such as a dead-reckoning, Loran C, or GPS location deriving information unit), and signals relating to the time of day (in the alternative, time of day information may be generated internal to the processing unit (103) in accordance with well understood prior art technique).

Figure 2:
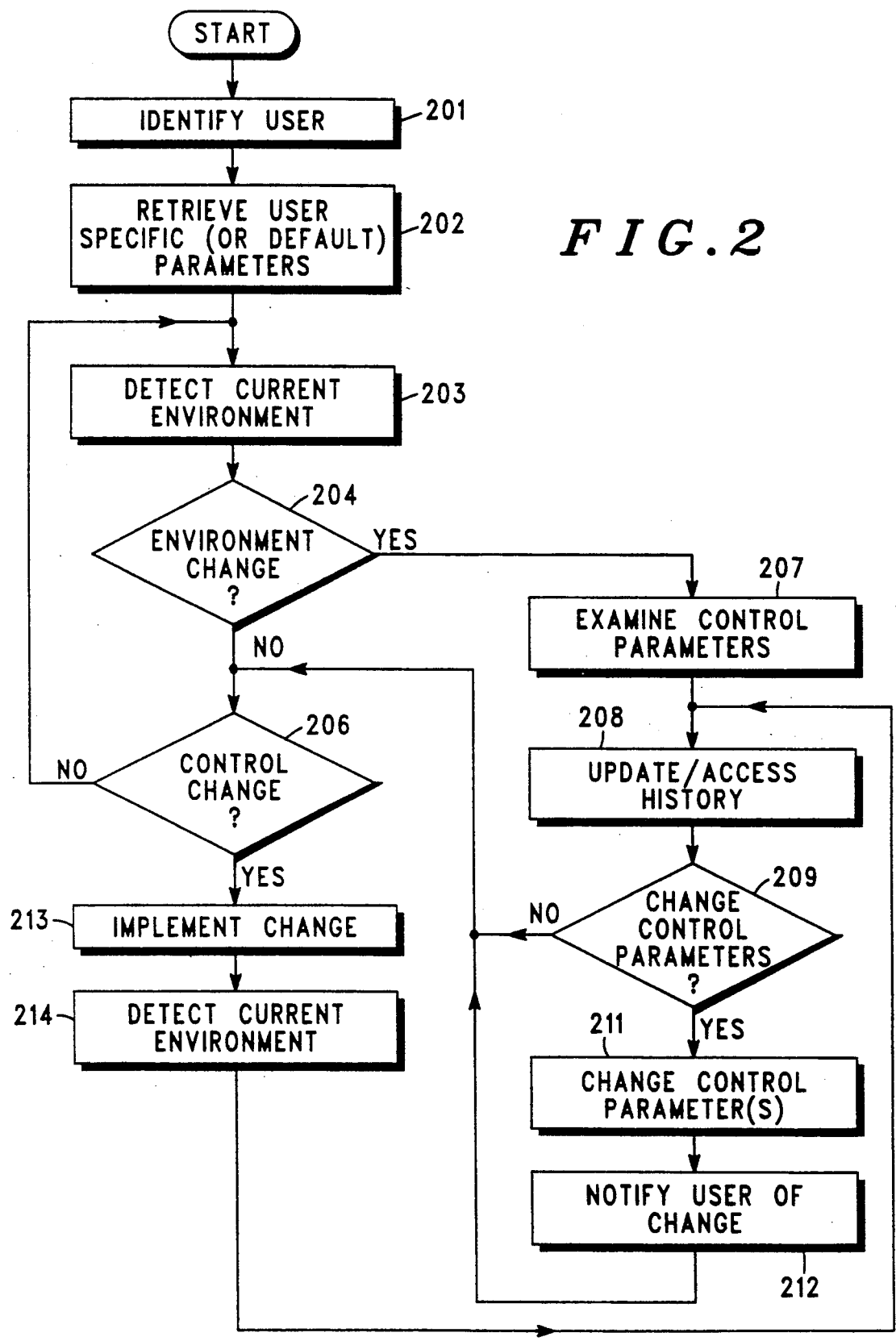
FIG. 2 comprises a flow diagram depicting general operation of the radio in accordance with the invention.

General operation of the radio (100) will now be described with reference to the flow diagram depicted in FIG. 2.

The processing unit (103) is programmed to control various radio operating parameters, in part as a function of operator input (as received, for example, through the input keys (111) or the speech recognition microphone (113)) and also as a function of environmental factors as sensed through the environmental parameter sensors (114). At start up, the processing unit (103) identifies the user (201). In this way, operation of the radio can be customized to each particular user. The user could be identified, for example, by requiring the user to input an ID code through the input keys (111), or by enunciating an ID code into the speech recognition microphone (113). In the alternative, the user could simply speak, and the processing unit (103) could utilize the speech recognition microphone (113) to receive the speech and compare the speech against a plurality of user speech templates to identify the speaker in that manner.

Upon identifying the specific user, the processing unit (103) retrieves the various parameters and other historical facts as previously stored for that user from the memory (202). In addition, particular rules, if any, pertinent to that specific user can also be retrieved. (For example, if only one user, of many users, is authorized to use encryption capabilities of the radio, then rules relating to operation of the encryption unit would only be retrieved from memory, or otherwise enabled in the processing unit, in response to this retrieval step for that user).

The processing unit (103) then monitors current environmental conditions (203) by monitoring the various environmental parameter sensor inputs (114). In the absence of environmental changes (204), the processor monitors for control parameter changes (206) as entered, for example, by the user. (For example, the user may adjust the volume of the radio, select a new scan mode, or initiate a particular call type.) If no control parameter changes are evident (206), the processing unit (103) returns to again sense environmental conditions (203), and the above steps continue until either an environmental change occurs or a control parameter change occurs.

When an environmental change occurs (204) the processing unit (103) examines the current state of the control parameters (207). The processing unit (103) then accesses the historical facts as stored in memory (208) and determines whether any control parameters require alteration in view of the changed environmental conditions (209). If not, the processing unit (103) returns to the control parameter monitoring step (206) described earlier.

If, however, the processing unit (103) determines that a control parameter requires alteration in view of the changed environmental condition as based upon the rules and facts set forth in the stored history, the processing unit changes the appropriate parameter or parameters (211) in accordance with the rules that govern operation of the radio (100). As an alternate step, the processing unit (103) may also notify the user of the changed control parameter (212).

The processing unit (103) then continues with the step of determining whether any control parameters have been changed by the user (206). If such a change has occurred, the processing unit (103) implements the change (213) to bring the radio (100) into conformity with the instructions of the user, and then detects the status of the current environmental conditions (214). The processing unit (103) then executes the update/access history step (208) in order to update the stored historical facts.

So configured, the processing unit (103) acts in accordance with the instructions of the user. In addition, the processing unit (103) can alter the control parameter settings of the radio (100) in response to various environmental conditions. Furthermore, the particular response made by the processing unit (103) in view of changing environmental conditions can vary with historical precedent. For example, if an initial rule provided to the processing unit (103) requires that the volume of the audio output of the radio (100) be increased by one step with every 10 miles per hour increase in speed of the vehicle within which the radio is located, and if in fact over time the stored facts regarding the user's actual actions in relation to environmental conditions indicates that the user tends to increase the volume by two steps with each increase of 10 miles per hour, the processing unit (103) can determine to automatically change the volume level of the radio by two steps with each 10 mile per hour increase in speed of the vehicle.

The learning process associated with the above example can be described as follows. When the vehicle has increased speed by more than 10 miles per hour, this is detected as an environmental change (204). Upon accessing its history and rules (208), the processing unit (103) will determine that the volume should be increased by one step (209) and will cause the volume to be increased by this amount (211). The user, however, having a personal preference for increasing the volume level by more than this one step amount, will cause the volume to be increased by yet another step, and this change will be detected by the processing unit (206). After implementing the change (213), the processing unit will again note the speed of the vehicle (214) and cause the history to be updated (208) to reflect this particular concurrence of events.

Thereafter, presuming the processing unit (103) operates under an appropriate set of guiding rules, such as, for example, allowing a particular rule to be modified when a user has caused modification of the results of the rule when exercised a particular number of times, the processing unit (103) will ultimately alter its operating rule to provide for a new rule wherein the volume is caused to increase by two steps with each 10 mile per hour increase in speed.

After implementing this rule, the user, being satisfied with the current volume level, will not alter the volume level and hence no subsequent parameter changes will be noted. The rule will thereafter be utilized, unless and until the user evinces other preferences, which thereafter result in corresponding changes to the rules used by the processing unit (103) to control operation of the radio.

What is claimed is:

1. An environmentally responsive radio having a plurality of operating parameters, at least some of which are selectively alterable, said radio comprising:
    A) input means for automatically obtaining information regarding at least some environmental conditions, which environmental conditions are external to the radio;
    B) memory means for storing:

i) information regarding at least some previous environmental conditions;
ii) information regarding previous settings for at least some operating parameters;

C) control means responsive to said input means and said memory means for automatically:
i) relating current environmental conditions and operating parameter settings to previous environmental conditions and operating parameter settings; and
ii) adjusting at least one of said selectively alterable operating parameters.

2. An environmentally responsive radio having a plurality of operating parameters, at least some of which are selectively alterable, said radio comprising:
A) input means for automatically obtaining information regarding at least some environmental conditions, which environmental conditions are external to the radio;
B) memory means for storing:
i) information regarding at least some previous environmental conditions;
ii) information regarding previous settings for at least some operating parameters;

C) control means responsive to said input means and said memory means for automatically:
i) relating current environmental conditions and operating parameter settings to previous environmental conditions and operating parameter settings; and
ii) when at least a predetermined relationship exists between current environmental conditions, current operating parameter settings, previous environmental conditions, and previous operating parameter settings, adjusting at least one of said selectively alterable operating parameters.

* * * * *

UNITED STATES PATENT AND TRADEMARK OFFICE
CERTIFICATE OF CORRECTION

PATENT NO. : 5,081,707

DATED : January 14, 1992

INVENTOR(S) : Eric R. Schorman et al.

It is certified that error appears in the above-identified patent and that said Letters Patent is hereby corrected as shown below:

Col. 4, line 65, between the words "some" and "environmental" please insert the word --current--.
    On line 66 after the comma please delete the word "which" and insert thereat --wherein said current--.

Col. 5, line 1, before the word "information" please insert --at least some of the information regarding current environmental conditions for use as historical--.
    On line 3 before the word "information" please insert --historical--.
    On line 4 between the words "some" and "operating" please insert the words --of the plurality of--.
    On line 9 between the words "relating" and "current" please insert the words --the information regarding--.
    On line 9, between the word "and" and "operating" please insert --current--.
    On line 10 please delete the word "previous" and insert thereat --the historical information regarding at least some of the previous--.
    On line 11 between the words "and" and "operating" please insert --the historical information regarding the previous settings for at least some of the plurality of--.
    On line 12 please delete the word "settings".
    On line 13 before the word "adjusting" please insert --in response thereto, automatically--.
    On line 20, between the words "some" and "environmental" please insert --current--.

Col. 6, line 1, after the comma please delete the word "which" and insert thereat --wherein said current--.
    On line 4 before the word "information" please insert the words --at least some of the information regarding current environmental conditions for use as historical--.
    On line 6 before the word "information" please insert --historical--.

UNITED STATES PATENT AND TRADEMARK OFFICE
CERTIFICATE OF CORRECTION

PATENT NO. : 5,081,707

DATED : January 14, 1992

INVENTOR(S) : Eric R. Schorman et al.

It is certified that error appears in the above-identified patent and that said Letters Patent is hereby corrected as shown below:

On line 7 between the words "some" and "operating" please insert --of the plurality of--.
On line 10 between the word "relating" and "current" please insert --the information regarding--.
On line 10 and 11 between the words "and" and "operating" please insert the word --current--.
On line 11 please delete the word "previous" and insert thereat --the historical information regarding at least some of the previous--.
On line 12 between the words "and" and "operating" please insert the words --the historical information regarding the previous settings for at least some of the plurality of--.
On line 13 please delete the word "settings".
On line 15 between the words "between" and "current" please insert --the information regarding--. On the same line after the comma please insert --the information regarding--.
On line 16 after "settings," please insert --the historical information regarding--.
On line 17 after the word "and" please insert --the historical information regarding--.

Signed and Sealed this

Twenty-ninth Day of June, 1993

Attest:

MICHAEL K. KIRK

*Attesting Officer*   *Acting Commissioner of Patents and Trademarks*